United States Patent
Speyer

(10) Patent No.: US 7,141,478 B2
(45) Date of Patent: Nov. 28, 2006

(54) MULTI-STAGE EPI PROCESS FOR FORMING SEMICONDUCTOR DEVICES, AND RESULTING DEVICE

(75) Inventor: Chris Speyer, Austin, TX (US)

(73) Assignee: Legerity Inc., Austin, TX (US)

( * ) Notice: Subject to any disclaimer, the term of this patent is extended or adjusted under 35 U.S.C. 154(b) by 217 days.

(21) Appl. No.: 10/764,777

(22) Filed: Jan. 26, 2004

(65) Prior Publication Data

US 2005/0164463 A1    Jul. 28, 2005

(51) Int. Cl.
*H01L 21/8222*    (2006.01)
*H01L 21/331*    (2006.01)

(52) U.S. Cl. ............ 438/309; 438/335; 438/341; 438/359

(58) Field of Classification Search ........ 438/309, 438/341, 363, 359, 335
See application file for complete search history.

(56) References Cited

U.S. PATENT DOCUMENTS

| | | | | |
|---|---|---|---|---|
| 4,307,180 A | * | 12/1981 | Pogge ............... | 438/424 |
| 4,997,776 A | * | 3/1991 | Harame et al. ...... | 438/313 |
| 5,070,031 A | * | 12/1991 | Zdebel ............... | 438/418 |
| 5,154,946 A | * | 10/1992 | Zdebel ............... | 438/207 |
| 5,177,025 A | * | 1/1993 | Turner et al. ...... | 438/309 |
| 5,326,710 A | * | 7/1994 | Joyce et al. ........ | 438/203 |
| 5,385,861 A | | 1/1995 | Bashir et al. ....... | 437/67 |
| 5,411,913 A | | 5/1995 | Bashir et al. ....... | 437/67 |
| 5,681,776 A | | 10/1997 | Hebert et al. ...... | 437/72 |
| 5,683,932 A | | 11/1997 | Bashir et al. ....... | 437/67 |
| 5,691,232 A | | 11/1997 | Bashir et al. ....... | 437/67 |
| 5,747,353 A | | 5/1998 | Bashir et al. ....... | 437/21 |
| 5,763,314 A | * | 6/1998 | Chittipeddi ......... | 438/400 |
| 5,773,350 A | | 6/1998 | Herbert et al. ..... | 438/364 |
| 5,780,343 A | | 7/1998 | Bashir ............... | 438/269 |
| 5,811,315 A | | 9/1998 | Yindeepol et al. .. | 437/62 |
| 5,914,523 A | | 6/1999 | Bashir et al. ....... | 257/520 |
| 5,930,635 A | | 7/1999 | Bashir et al. ....... | 438/313 |
| 5,952,706 A | | 9/1999 | Bashir ............... | 257/587 |
| 6,051,446 A | | 4/2000 | Moore et al. ....... | 438/36 |
| 6,121,148 A | | 9/2000 | Bashir et al. ....... | 438/692 |
| 6,362,064 B1 | | 3/2002 | McGregor et al. .. | 438/318 |

* cited by examiner

*Primary Examiner*—Michael Trinh
(74) *Attorney, Agent, or Firm*—Williams, Morgan & Amerson, P.C.

(57) ABSTRACT

The present invention is generally directed to a multi-stage epi process for forming semiconductor devices, and the resulting device. In one illustrative embodiment, the method comprises forming a first layer of epitaxial silicon above a surface of a semiconducting substrate, forming a second layer of epitaxial silicon above the first layer of epitaxial silicon, forming a third layer of epitaxial silicon above the second layer of epitaxial silicon, forming a trench isolation region that extends through at least the third layer of epitaxial silicon and forming a portion of a semiconductor device above the third layer of epitaxial silicon within an area defined by the isolation region. In one illustrative embodiment, the device comprises a substrate, a first layer of epitaxial silicon formed above the substrate, a second layer of epitaxial silicon formed above the first layer of epitaxial silicon, a third layer of epitaxial silicon formed above the second layer of epitaxial silicon, a trench isolation region that extends through at least the third layer of epitaxial silicon, the trench isolation region defining an active area, and at least one component of a semiconductor device formed in or above the third layer of epitaxial silicon within the active area.

45 Claims, 3 Drawing Sheets

MULTI-STAGE EPI PROCESS FOR FORMING SEMICONDUCTOR DEVICES, AND RESULTING DEVICE

BACKGROUND OF THE INVENTION

1. Field of the Invention

This invention relates generally to the fabrication of semiconductor devices, and, more particularly, to a multi-stage epi process for forming semiconductor devices, and the resulting device.

2. Description of the Related Art

Manufacturing semiconductor devices is a very complex, cost-intensive, and competitive industry. Manufacturing a semiconductor device may involve performing hundreds of individual process steps, such as forming layers of materials, selectively removing portions of those layers of materials, implanting dopant atoms into various structures on the substrate and performing various heat treatment processes. Such steps are combined in any of a vast variety of different process flows to produce semiconductor devices that function in the desired manner.

The semiconductor manufacturing industry is very competitive in that there is a constant drive to reduce the unit cost of semiconductor devices and to increase product yields. Thus, there is constant pressure to develop new and improved processes for manufacturing semiconductor devices so that product yields may be increased and/or costs may be reduced. For example, in the case of high voltage bipolar devices that are isolated by trench isolation regions, the manufacturing of such devices can be quite complex. Such processes typically involve performing an ion implant process into a bulk substrate to thereby form a buried sub-collector layer. Subsequent fabrication involves performing multiple epitaxial deposition steps to form multiple layers of epitaxial silicon at various stages during the course of the manufacture of the device.

Moreover, in some cases, trench isolation regions used to isolate a semiconductor device have very high aspect ratios, i.e., the ratio of trench depth to trench width, for example on the order of approximately 25–30. In forming such trench isolation regions, it is often necessary to perform a so-called channel stop implant step in an effort to introduce dopant materials into the substrate adjacent the bottom of the previously formed trench. The channel stop implant serves a variety of purposes, e.g., preventing latch-up, tub-to-tub leakage, cross-talk, etc. However, in modem devices that have isolation trenches with very high aspect ratios, e.g., high voltage devices, it is very difficult to properly introduce the desired dopant material at the bottom of such a trench. More specifically, two problems may arise. First, there may be inadequate dopant material placed in the substrate adjacent the bottom of the trench, thereby leading to the problems identified above, e.g., latch-up, cross-talk, etc. If the dopant dose of the ion implant process is increased to insure that dopant material is present in the substrate adjacent the bottom of the trench, then, due to the high aspect ratio, excessive amounts of dopant material penetrate the sidewalls of the trench leading to other problems, e.g., increased consumption of plot space, poor electrical performance, etc.

In view of the foregoing, there is a need for an improved methodology for forming semiconductor devices that may improve product yields, reduce costs and increase overall manufacturing efficiency. The present invention is directed to a method that may solve, or at least reduce, some or all of the aforementioned problems.

SUMMARY OF THE INVENTION

The present invention is generally directed to a multi-stage epi process for forming semiconductor devices, and the resulting device. In one illustrative embodiment, the method comprises forming a first layer of epitaxial silicon above a surface of a semiconducting substrate, forming a second layer of epitaxial silicon above the first layer of epitaxial silicon, forming a third layer of epitaxial silicon above the second layer of epitaxial silicon, forming a trench isolation region that extends through at least the third layer of epitaxial silicon and forming a portion of a semiconductor device above the third layer of epitaxial silicon within an area defined by the isolation region.

In another illustrative embodiment, the method comprises forming a first layer of epitaxial silicon above a surface of a semiconducting substrate, the semiconducting substrate being doped with a first type of dopant material, forming a second layer of epitaxial silicon above the first layer of epitaxial silicon, the second layer of epitaxial silicon being doped with a dopant material that is of a type opposite to that of the first type of dopant material, forming a third layer of epitaxial silicon above the second layer of epitaxial silicon, the third layer of epitaxial silicon being doped with a dopant material that is of a type opposite to that of the first type of dopant material, wherein the second layer of epitaxial silicon has a greater concentration level of dopant material than the third layer of epitaxial silicon, forming a trench isolation region that extends through at least the third layer of epitaxial silicon, and forming a semiconductor device above the third layer of epitaxial silicon within an area defined by the isolation region.

In yet another illustrative embodiment, the method comprises performing an in situ epitaxial growth process in a single epitaxial reactor to form a first layer of epitaxial silicon above a surface of a semiconducting substrate, the semiconducting substrate being doped with a first type of dopant material, a second layer of epitaxial silicon above the first layer of epitaxial silicon, the second layer of epitaxial silicon being doped with a dopant material that is of a type opposite to that of the first type of dopant material, and a third layer of epitaxial silicon above the second layer of epitaxial silicon, the third layer of epitaxial silicon being doped with a dopant material that is of a type opposite to that of the first type of dopant material, wherein the second layer of epitaxial silicon has a greater concentration level of dopant material than the third layer of epitaxial silicon. The method further comprises forming a trench isolation region that extends through at least the second and third layers of epitaxial silicon and forming a semiconductor device above the third layer of epitaxial silicon within an area defined by the isolation region.

In one illustrative embodiment, the device comprises a substrate, a first layer of epitaxial silicon formed above the substrate, a second layer of epitaxial silicon formed above the first layer of epitaxial silicon, a third layer of epitaxial silicon formed above the second layer of epitaxial silicon, a trench isolation region that extends through at least the third layer of epitaxial silicon, the trench isolation region defining an active area, and at least one component of a semiconductor device formed in or above the third layer of epitaxial silicon within the active area.

In another illustrative embodiment, the device comprises a substrate, the substrate being doped with a dopant material of a first type, a first layer of epitaxial silicon formed above the substrate, a second layer of epitaxial silicon formed above the first layer of epitaxial silicon, the second layer of epitaxial silicon being doped with a dopant material that is of a type opposite to that of the first type of dopant material, a third layer of epitaxial silicon formed above the second layer of epitaxial silicon, the third layer of epitaxial silicon being doped with a dopant material that is of a type opposite to that of the first type of dopant material, wherein the second layer of epitaxial silicon has a greater concentration level of dopant material than the third layer of epitaxial silicon, a trench isolation region that extends through at least the third layer of epitaxial silicon, the trench isolation region defining an active area, and at least one component of a semiconductor device formed in or above the third layer of epitaxial silicon within the active area.

BRIEF DESCRIPTION OF THE DRAWINGS

The invention may be understood by reference to the following description taken in conjunction with the accompanying drawings, in which like reference numerals identify like elements, and in which.

Figure 1:
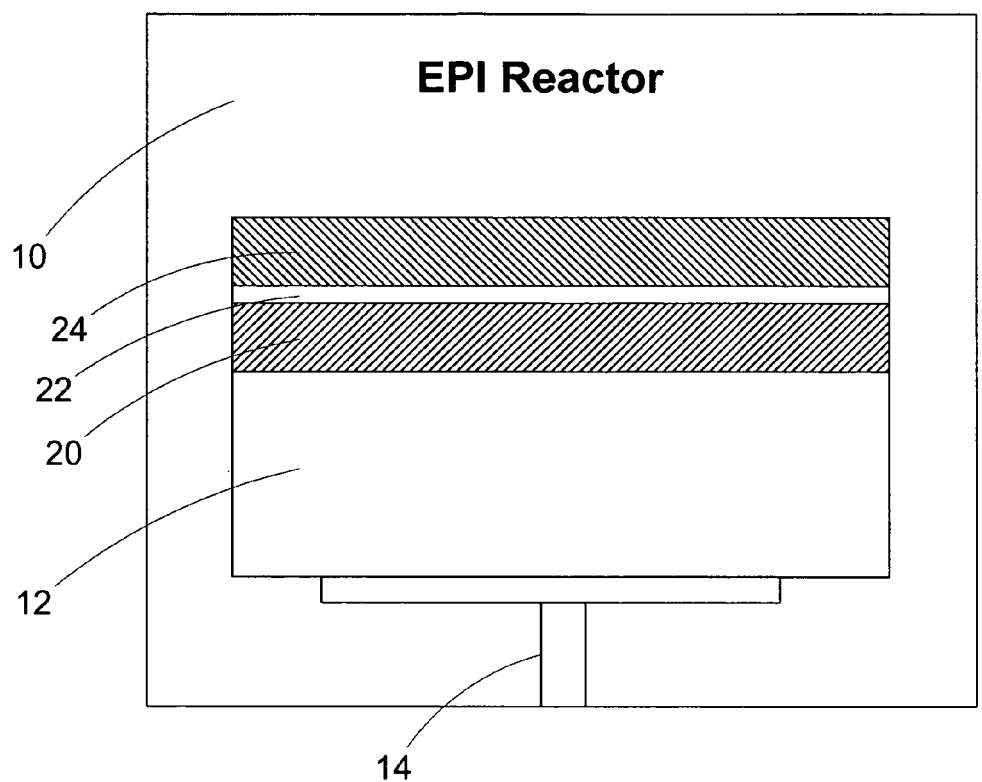
FIG. 1 schematically depicts an illustrative epi reactor having a substrate in accordance with one embodiment of the present invention position therein.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various layers and structures of the semiconductor device are depicted in the drawings as having very precise, sharp configurations and profiles, those skilled in the art recognize that, in reality, these regions and structures may not be as precise as indicated in the drawings. Additionally, the relative sizes of the various features and layers depicted in the drawings may be exaggerated or reduced as compared to the size of those features or layers on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to a multi-stage epi process for forming semiconductor devices, and the resulting device. As will be readily apparent to those skilled in the art upon a complete reading of the present application, the present invention may be employed in connection with the formation of a variety of different semiconductor devices, e.g., memory devices, logic devices, transistors, diodes, resistors, etc. Moreover, the present invention may be employed with a variety of different technologies, e.g., CMOS, PMOS, NMOS devices, as well as bipolar devices. Thus, the present invention should not be considered as limited to any particular type of device or other methodologies employed in forming such a semiconductor device unless such limitations are expressly set forth in the appended claims.

FIG. 1 schematically depicts an illustrative epi reactor 10 having a substrate 12 in accordance with one embodiment of the present invention position therein. The substrate 12 is generally comprised of a first epi layer 20, a second epi layer 22 and a third epi layer 24, as indicated in FIG. 1. The substrate 12 is positioned on an illustrative wafer stage 14 within the epi reactor 10. The epi reactor 10 may be employed to form the various epi layers 20, 22, 24 in the manner described below. The epi reactor 10 depicted in FIG. 1 is intended to be illustrative in nature as it may be any type of device or tool capable of forming epitaxial layers of silicon in accordance with the methodologies described herein. The epi reactor 10 depicted in FIG. 1 does not include all of the valving and support structure employed on an actual epi reactor so as not to obscure the present invention. In one illustrative embodiment, the epi reactor 10 is a Model Epsilon 1 sold by ASM Tools. The substrate 12 may be doped with either N- or P-type dopants depending upon the particular application. Moreover, the substrate 12 may be any physical size, e.g., 125–300 mm diameter wafers.

Aspects of the invention will now be described with reference to FIGS. 2–4. As will be understood by those skilled in the art after a complete reading of the present application, the various dopant materials described herein may be reversed depending on a particular application. That is, in one embodiment, the various layers and structures may be doped with P-type dopant materials, whereas, in the alternative, they may also be doped with N-type dopant materials for a particular application. Thus, the particular dopant materials employed, their type, and their concentration should not be considered a limitation of the present invention unless such limitations are expressly set forth in the appended claims.

For ease of explanation, the present invention will be disclosed in the context where the substrate 12 is provided with a relatively high concentration of P-type dopant materials. However, as set forth immediately above, depending upon the particular application, the starting bulk substrate 12 could be doped with N-type dopant materials. In this illustrative example, the bulk substrate 12 has a concentration of P-type dopant material, e.g., boron, boron difluoride, that ranges from approximately $1e^{17}$–$5e^{17}$ ions/cm$^3$. The relatively high dopant concentration of the substrate 12 is in contrast to prior art substrates which typically start with a much lower level of P-type dopant material. In the case where the substrate is doped with N-type dopant material, arsenic or phosphorous may be used as the dopant material.

Figure 2:
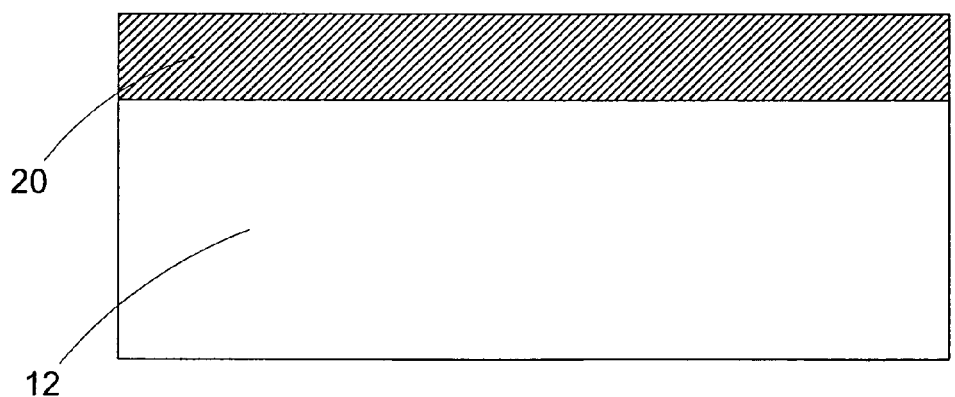
FIG. 2 is a depiction of a substrate having an initial layer of epitaxial silicon formed thereabove.
Figure 3:
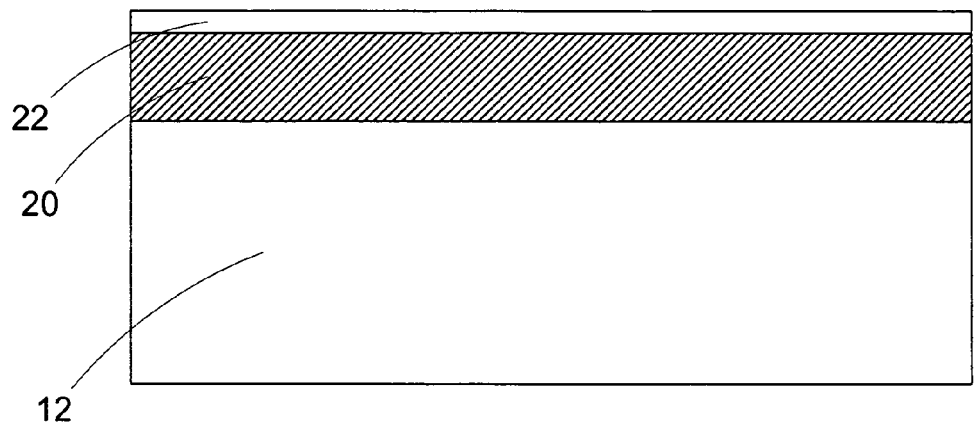
FIG. 3 depicts the device of FIG. 2 wherein a second layer of epitaxial silicon is formed thereabove.

Next, as indicated in FIG. 2, a first layer of epitaxial silicon 20 is formed above the substrate 12. The thickness of the first layer of epitaxial silicon 20 may vary depending upon the particular application. In one illustrative embodiment where a semiconductor device has an operating voltage on the order of approximately 100 volts, the first layer of epitaxial silicon 20 may have a thickness of approximately 15–30 microns. The first layer of epitaxial silicon 20 may be either doped or undoped. In the case where dopant material is introduced into the first layer of epitaxial silicon 20, it may be either N-type or P-type dopant irrespective of the type of dopant material present in the substrate 12. However, in the case where dopant materials are introduced into the first layer of epitaxial silicon 20, the dopant concentration of the first layer of epitaxial silicon 20 should be less than approximately $1e^{15}$ ions/cm$^3$.

Next, the second layer of epitaxial silicon 22 is formed above the first layer of epitaxial silicon 20. The second layer of epitaxial silicon 22 has a relatively high level of dopant material. For example, in the case where the substrate 12 is doped with a P-type dopant material, the second layer of epitaxial silicon 22 may have a concentration of N-type dopant materials, e.g., arsenic, phosphorous, greater than approximately $5e^{17}$ ions/cm$^3$. This results in the second layer of epitaxial silicon 22 having a resistivity less than approximately 0.2 ohm-cm. The thickness of the second layer of epitaxial silicon 22 may also vary depending upon the particular application. In one illustrative embodiment, the thickness of the second layer of epitaxial silicon 22 may range from approximately 0.5–2.0 microns. It should be understood that the second layer of epitaxial silicon 22 is doped with a dopant material that is opposite to the type of dopant material present in the substrate 12. That is, if the substrate 12 is doped with P-type dopant material, then an N-type dopant material is introduced into the second layer of epitaxial silicon 22, and vice versa.

Figure 4:
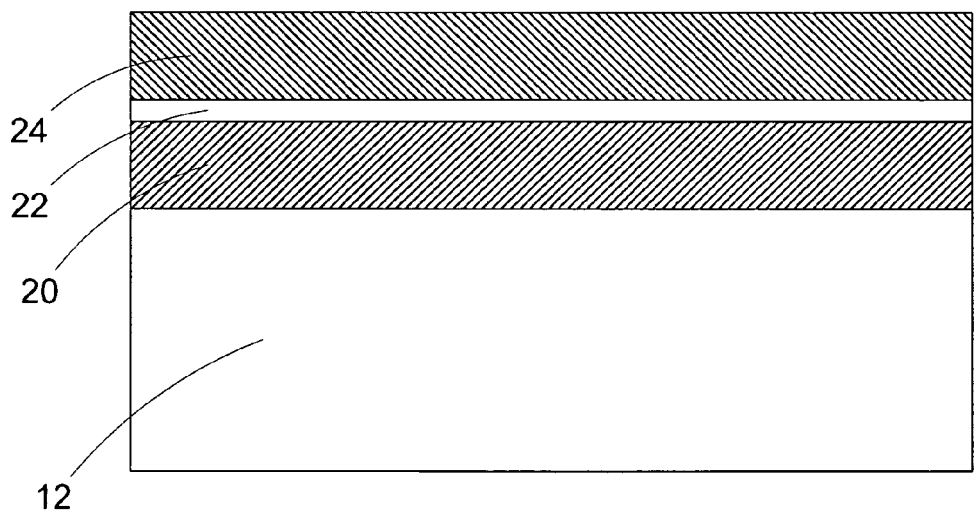
FIG. 4 depicts the device of FIG. 3 wherein a third layer of epitaxial silicon is formed thereabove.

Next, as indicated in FIG. 4, a third layer of epitaxial silicon 24 is formed above the second layer of epitaxial silicon 22. The third layer of epitaxial silicon 24 will also be doped with a dopant material that is opposite to the type of dopant material in the substrate 12. In the depicted embodiment where the substrate 12 is doped with a P-type dopant material, the third layer of epitaxial silicon 24 is doped with an N-type dopant material, e.g., arsenic, phosphorous. However, the dopant concentration of the third layer of epitaxial silicon 24 is less than that of the dopant concentration in the second layer of epitaxial silicon 22. For example, the third layer of epitaxial silicon may have a dopant concentration level that ranges approximately $5e^{14}$–$1e^{15}$ ions/cm$^3$ resulting in a resistivity of approximately 4.5–9.0 ohm-cm. Higher doping concentrations may be employed in higher voltage applications. The thickness of the third layer of epitaxial silicon 24 may also vary depending upon the particular application. In one illustrative embodiment, the third layer of epitaxial silicon 24 may have a thickness that ranges from approximately 20–25 microns.

In general, the various epitaxial layers 20, 22, 24 may be formed in a single multi-stage epi deposition process within the epi reactor 10. That is, the various epitaxial layers 20, 22, 24 may be formed above the substrate 12 without breaking a vacuum. The dopant type and concentration level of each of the various layers may be controlled by controlling the gases supplied to the epi reactor 10 during the various stages of the multi-stage process. For example, when it is desired to increase the dopant concentration of a layer of epi material presently being formed relative to that of a previously formed layer, the flow rate of various process gases may be increased. Conversely, when it is desired to reduce the concentration level, the flow rate of such gases into the epi reactor 10 may be decreased. The exact control parameters for the flow of such gases will depend upon the particular application, and the reaction gases involved in the epitaxial deposition process. In general, the epitaxial deposition process should be controlled such that the boundary between the various layers 20, 22, 24 is as sharp as possible, i.e., all other things being equal, it would be desirable to minimize the transition region. Thus, at some stages of a particular process flow, it may be desirable to grow epitaxial silicon relatively fast, and then slow the process down when it is desirable to increase the dopant concentration in a subsequently formed layer. That is, the deposition process may be slowed down until such time as the dopant concentration levels within the epi reactor 10 rise.

The present invention may be employed in the manufacture of any of a variety of different semiconductor devices. Even more specifically, the present invention may be employed with a variety of high voltage semiconductor devices that are isolated by trench isolation regions. For example, the present invention may be employed in the manufacture of bipolar devices, CMOS transistors, DMOS transistors, HBTs, resistors, capacitors, diodes, memory devices, etc. In one illustrative embodiment, the present invention has applicability in relatively high voltage applications, i.e., voltages exceeding approximately 50–100 volts. However, it should be understood that the present invention is not limited to any particular type of device, or its applicable voltage level. Thus, the present invention should not be considered so limited unless such limitations appear in the appended claims.

Figure 6:
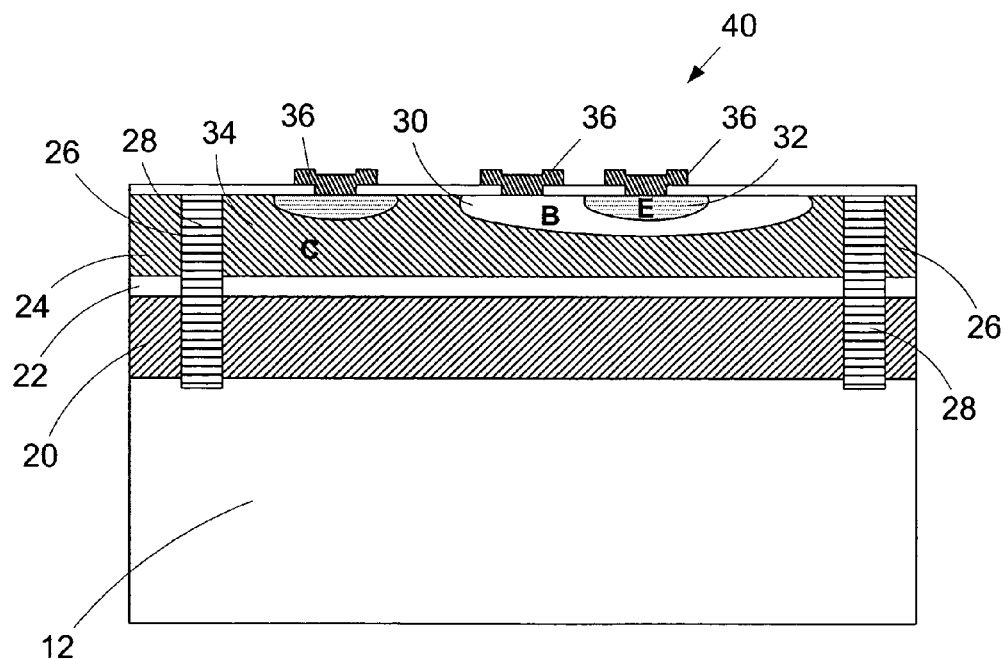
FIG. 6 depicts an illustrative semiconductor device formed above the substrate in accordance with one illustrative embodiment of the present invention.

After the various epitaxial layers 20, 22, 24 are formed above the substrate, as indicated in FIG. 4, traditional processing operations may be performed to form any of a variety of semiconductor devices above the substrate 12, i.e., in or above the third layer of epitaxial silicon 24. By way of example only, FIG. 6 depicts an illustrative bipolar transistor 40 formed above the substrate 12. In the illustrative example where a bipolar transistor is formed above the substrate 12 depicted in FIG. 4, the first layer of epitaxial silicon 20 serves essentially as a transition layer, the second layer of epitaxial silicon 22 functions as a sub-collector in the finished product, and the third layer of epitaxial silicon 24 functions as the collector in such a completed device. As a result of various heat treatments performed in manufacturing such a device, the dopant materials in the various epitaxial layers, e.g., 22, 24 and the substrate 12, tend to migrate or out-diffuse. Thus, in the illustrative example depicted in FIG. 4, P-type dopant material from the substrate 12 and N-type dopant material from the second epitaxial layer 22 tend to diffuse into the first layer of epitaxial silicon 20. It is for this reason that the first layer of epitaxial silicon 20 may not be doped, or if it is doped, the concentration is relatively small. In the illustrative example where a bipolar device is formed above the structure depicted in FIG. 4, the first epitaxial layer 20 is provided to raise the breakdown voltage between the second layer of epitaxial silicon 22, i.e., the sub-collector, and the substrate 12.

Figure 5:
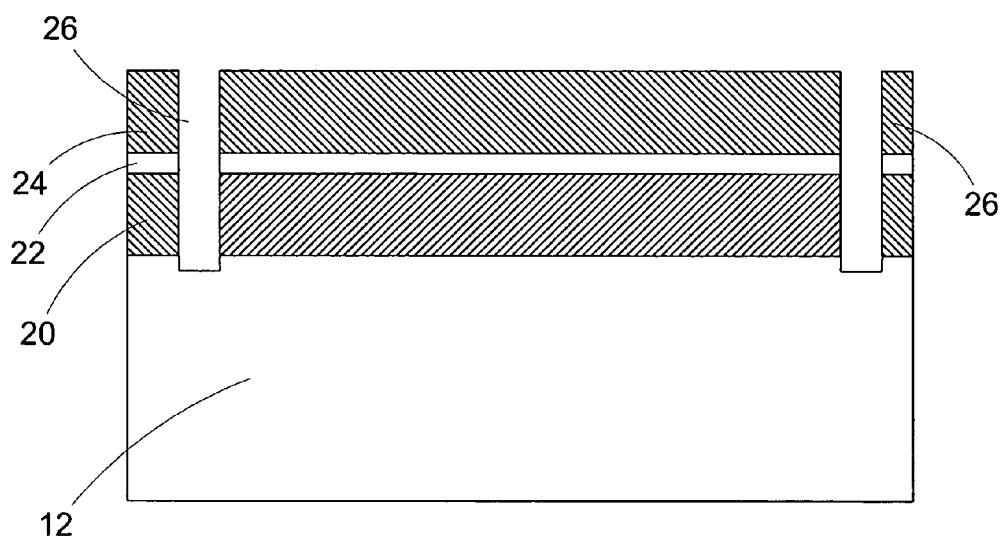
FIG. 5 depicts the device of FIG. 4 wherein a plurality of trenches have been formed therein.

Such a device may be formed using a variety of known techniques. Initially, as shown in FIG. 5, a trench 26 is formed above the substrate 12 using known photolithography and etching techniques. The trench 26 extends at least through the third layer of epitaxial silicon 24. In some cases, the trench 26 extends through all three layers of epitaxial silicon 20, 22, 24 and into the substrate 12. Thereafter, as indicated in FIG. 6, the trench 26 is filled with an illustratively depicted insulation material 28. Of course, as will be understood by those skilled in the art, the insulating material 28 is representative in nature in that the trench 26 may be filled with any of a variety of materials which enable it to perform its intended function. Moreover, the trench 26 may be filled with multiple different types of material. Thus, the schematic representation of an insulation filled trench 28 should not be considered a limitation of the present invention unless such limitations appear in the appended claims.

Next, any of a variety of known processes may be used to form the various components of the bipolar transistor 40. For example, in the illustrative embodiment depicted in FIG. 6, the bipolar transistor 40 is comprised of a base 30, an emitter 32 and a collector 34. A plurality of contacts 36 are provided to each of the various components in accordance with known processing techniques.

As stated previously, the present invention may be employed with a variety of different types of devices. In the embodiment described herein, the substrate 12 is doped with a P-type dopant material, e.g., boron, and the second and third layers of epitaxial silicon 22, 24 are doped with an N-type dopant material, e.g., arsenic, phosphorous. The particular dopant material used in the second layer of epitaxial silicon 22 may differ from the particular dopant material used in the third layer of epitaxial silicon 24. However, the invention may also be employed in situations where the substrate 12 is doped with an N-type dopant material and the second and third layers of epitaxial silicon 22, 24 are doped with a P-type dopant material. In either situation, the concentration level of dopant atoms in the second layer of epitaxial silicon 22 should be higher than the concentration of dopant atoms in the third layer of epitaxial silicon 24.

Through use of the present invention, product yields may be increased and costs may be reduced. More specifically, by employing the methodologies disclosed herein, an ion implant step may be omitted from the process flow of forming an illustrative bipolar device and all of the epitaxial layers may be formed in a single multi-stage epi deposition process. This is in contrast to the prior art methodologies used in forming some bipolar devices in which an ion implant process was performed to form the sub-collector for bipolar devices and wherein separate epi deposition steps were performed to form the desired epitaxial silicon layers for the semiconductor device.

The present invention is generally directed to a multi-stage epi process for forming semiconductor devices, and the resulting device. In one illustrative embodiment, the method comprises forming a first layer of epitaxial silicon above a surface of a semiconducting substrate, forming a second layer of epitaxial silicon above the first layer of epitaxial silicon, forming a third layer of epitaxial silicon above the second layer of epitaxial silicon, forming a trench isolation region that extends through at least the third layer of epitaxial silicon and forming a portion of a semiconductor device above the third layer of epitaxial silicon within an area defined by the isolation region.

In another illustrative embodiment, the method comprises forming a first layer of epitaxial silicon above a surface of a semiconducting substrate, the semiconducting substrate being doped with a first type of dopant material, forming a second layer of epitaxial silicon above the first layer of epitaxial silicon, the second layer of epitaxial silicon being doped with a dopant material that is of a type opposite to that of the first type of dopant material, forming a third layer of epitaxial silicon above the second layer of epitaxial silicon, the third layer of epitaxial silicon being doped with a dopant material that is of a type opposite to that of the first type of dopant material, wherein the second layer of epitaxial silicon has a greater concentration level of dopant material than the third layer of epitaxial silicon, forming a trench isolation region that extends through at least the third layer of epitaxial silicon, and forming a semiconductor device above the third layer of epitaxial silicon within an area defined by the isolation region.

In yet another illustrative embodiment, the method comprises performing an in situ epitaxial growth process in a single epitaxial reactor to form a first layer of epitaxial silicon above a surface of a semiconducting substrate, the semiconducting substrate being doped with a first type of dopant material, a second layer of epitaxial silicon above the first layer of epitaxial silicon, the second layer of epitaxial silicon being doped with a dopant material that is of a type opposite to that of the first type of dopant material, and a third layer of epitaxial silicon above the second layer of epitaxial silicon, the third layer of epitaxial silicon being doped with a dopant material that is of a type opposite to that of the first type of dopant material, wherein the second layer of epitaxial silicon has a greater concentration level of dopant material than the third layer of epitaxial silicon. The method further comprises forming a trench isolation region that extends through at least the second and third layers of epitaxial silicon and forming a semiconductor device above the third layer of epitaxial silicon within an area defined by the isolation region.

In one illustrative embodiment, the device comprises a substrate, a first layer of epitaxial silicon formed above the substrate, a second layer of epitaxial silicon formed above the first layer of epitaxial silicon, a third layer of epitaxial silicon formed above the second layer of epitaxial silicon, a trench isolation region that extends through at least the third layer of epitaxial silicon, the trench isolation region defining an active area, and at least one component of a semiconductor device formed in or above the third layer of epitaxial silicon within the active area.

In another illustrative embodiment, the device comprises a substrate, the substrate being doped with a dopant material of a first type, a first layer of epitaxial silicon formed above the substrate, a second layer of epitaxial silicon formed above the first layer of epitaxial silicon, the second layer of epitaxial silicon being doped with a dopant material that is of a type opposite to that of the first type of dopant material, a third layer of epitaxial silicon formed above the second layer of epitaxial silicon, the third layer of epitaxial silicon being doped with a dopant material that is of a type opposite to that of the first type of dopant material, wherein the second layer of epitaxial silicon has a greater concentration level of dopant material than the third layer of epitaxial silicon, a trench isolation region that extends through at least the third layer of epitaxial silicon, the trench isolation region defining an active area, and at least one component of a semiconductor device formed in or above the third layer of epitaxial silicon within the active area.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
forming a first layer of epitaxial silicon having a thickness of approximately 15–30 microns above a surface of a semiconducting substrate;
forming a second layer of epitaxial silicon having a thickness of approximately 0.5–2.0 microns on said first layer of epitaxial silicon;
forming a third layer of epitaxial silicon having a thickness of approximately 20–25 microns on said second layer of epitaxial silicon, wherein said semiconducting substrate is doped with a dopant material of a first type and said second and third layers of epitaxial silicon are doped with a dopant material that is of a type opposite to that of said first type of dopant material, and wherein said first, second and third layers of epitaxial silicon are formed by performing an in situ epitaxial growth process in a single epitaxial reactor;
forming a trench isolation region that extends through at least said third layer of epitaxial silicon; and
forming a portion of a semiconductor device above said third layer of epitaxial silicon within an area defined by said isolation region.

2. The method of claim 1, wherein said semiconducting substrate is doped with a P-type dopant material and said second and third layers of epitaxial silicon are doped with an N-type dopant material.

3. The method of claim 1, wherein said semiconducting substrate is doped with an N-type dopant material and said second and third layers of epitaxial silicon are doped with a P-type dopant material.

4. The method of claim 1, wherein said first layer of epitaxial silicon is an undoped layer of epitaxial silicon.

5. The method of claim 1, wherein said first layer of epitaxial silicon is doped with either a P-type or an N-type dopant material.

6. The method of claim 1, wherein said second and third layers of epitaxial silicon are doped layers of epitaxial silicon and wherein said second layer of epitaxial silicon has a greater concentration level of dopant material than said third layer of epitaxial silicon.

7. The method of claim 1, wherein said substrate has a dopant concentration of approximately $1e^{17}$–$5e^{17}$ ions/cm$^3$ of a P-type dopant material.

8. The method of claim 7, wherein said first layer of epitaxial silicon has a dopant concentration less than approximately $1e^{15}$ ions/cm$^3$ of an N-type dopant material.

9. The method of claim 7, wherein said second layer of epitaxial silicon has a dopant concentration greater than approximately $5e^{17}$ ions/cm$^3$ of an N-type dopant material.

10. The method of claim 7, wherein said third layer of epitaxial silicon has a dopant concentration of approximately $5e^{14}$–$1e^{15}$ ions/cm$^3$ of an N-type dopant material.

11. The method of claim 1, wherein said substrate has a dopant concentration of approximately $1e^{17}$–$5e^{17}$ ions/cm$^3$ of an N-type dopant material.

12. The method of claim 11, wherein said first layer of epitaxial silicon has a dopant concentration less than approximately $1e^{15}$ ions/cm$^3$ of a P-type dopant material.

13. The method of claim 11, wherein said second layer of epitaxial silicon has a dopant concentration greater than approximately $5e^{17}$ ions/cm$^3$ of a P-type dopant material.

14. The method of claim 11, wherein said third layer of epitaxial silicon has a dopant concentration of approximately $5e^{14}$–$1e^{15}$ ions/cm$^3$ of a P-type dopant material.

15. The method of claim 1, wherein forming a trench isolation region comprises:
performing at least one etching process to form a trench that extends through at least said third layer of epitaxial silicon; and
forming at least one insulating material in said trench.

16. The method of claim 1, wherein said semiconductor device comprises at least one of a bipolar transistor, a resistor, a diode, a logic device and a memory device.

17. A method, comprising:
forming a first layer of epitaxial silicon having a thickness of approximately 15–30 microns above a surface of a semiconducting substrate, said semiconducting substrate being doped with a first type of dopant material;
forming a second layer of epitaxial silicon having a thickness of approximately 0.5–2.0 microns on said first layer of epitaxial silicon, said second layer of epitaxial silicon being doped with a dopant material that is of a type opposite to that of said first type of dopant material;
forming a third layer of epitaxial silicon having a thickness of approximately 20–25 microns on said second layer of epitaxial silicon, said third layer of epitaxial silicon being doped with a dopant material that is of a type opposite to that of said first type of dopant material, wherein said second layer of epitaxial silicon has a greater concentration level of dopant material than said third layer of epitaxial silicon, wherein said first, second and third layers of epitaxial silicon are formed by performing an in situ epitaxial growth process in a single epitaxial reactor;
forming a trench isolation region that extends through at least said third layer of epitaxial silicon; and
forming a semiconductor device above said third layer of epitaxial silicon within an area defined by said isolation region.

18. The method of claim 17, wherein said semiconducting substrate is doped with a P-type dopant material and said second and third layers of epitaxial silicon are doped with an N-type dopant material.

19. The method of claim 17, wherein said semiconducting substrate is doped with an N-type dopant material and said second and third layers of epitaxial silicon are doped with a P-type dopant material.

20. The method of claim 17, wherein said first layer of epitaxial silicon is an undoped layer of epitaxial silicon.

21. The method of claim 17, wherein said first layer of epitaxial silicon is doped with either a P-type or an N-type dopant material.

22. The method of claim 17, wherein said substrate has a dopant concentration of approximately $1e^{17}$–$5e^{17}$ ions/cm$^3$ of a P-type dopant material.

23. The method of claim 22, wherein said first layer of epitaxial silicon has a dopant concentration less than approximately $1e^{15}$ ions/cm$^3$ of an N-type dopant material.

24. The method of claim 22, wherein said second layer of epitaxial silicon has a dopant concentration greater than approximately $5e^{17}$ ions/cm$^3$ of an N-type dopant material.

25. The method of claim 22, wherein said third layer of epitaxial silicon has a dopant concentration of approximately $5e^{14}$–$1e^{15}$ ions/cm$^3$ of an N-type dopant material.

26. The method of claim 17, wherein said substrate has a dopant concentration of approximately $1e^{17}$–$5e^{17}$ ions/cm$^3$ of an N-type dopant material.

27. The method of claim 26, wherein said first layer of epitaxial silicon has a dopant concentration less than approximately $1e^{15}$ ions/cm$^3$ of a P-type dopant material.

28. The method of claim 26, wherein said second layer of epitaxial silicon has a dopant concentration greater than approximately $5e^{17}$ ions/cm$^3$ of a P-type dopant material.

29. The method of claim 26, wherein said third layer of epitaxial silicon has a dopant concentration of approximately $5e^{14}$–$1e^{15}$ ions/cm$^3$ of a P-type dopant material.

30. The method of claim 17, wherein forming a trench isolation region comprises:
performing at least one etching process to form a trench that extends through at least said third layer of epitaxial silicon; and
forming at least one insulating material in said trench.

31. The method of claim 17, wherein said semiconductor device comprises at least one of a bipolar transistor, a resistor, a diode, a logic device and a memory device.

32. A method, comprising:
performing an in situ epitaxial growth process in a single epitaxial reactor to form:
a first layer of epitaxial silicon having a thickness of approximately 15–30 microns above a surface of a semiconducting substrate, said
semiconducting substrate being doped with a first type of dopant material,
a second layer of epitaxial silicon having a thickness of approximately 0.5–2.0 microns on said first layer of epitaxial silicon, said second layer of epitaxial silicon being doped with a dopant material that is of a type opposite to that of said first type of dopant material, and
a third layer of epitaxial silicon having a thickness of approximately 20–25 microns on said second layer of epitaxial silicon, said third layer of epitaxial silicon being doped with a dopant material that is of a type opposite to that of said first type of dopant material, wherein said second layer of epitaxial silicon has a greater concentration level of dopant material than said third layer of epitaxial silicon;
forming a trench isolation region that extends through at least said second and third layers of epitaxial silicon by performing at least one etching process to form a trench that extends through at least said second and third layers of epitaxial silicon and forming at least one insulating material in said trench; and
forming a semiconductor device above said third layer of epitaxial silicon within an area defined by said isolation region.

33. The method of claim 32, wherein said semiconducting substrate is doped with a P-type dopant material and said second and third layers of epitaxial silicon are doped with an N-type dopant material.

34. The method of claim 32, wherein said semiconducting substrate is doped with an N-type dopant material and said second and third layers of epitaxial silicon are doped with a P-type dopant material.

35. The method of claim 32, wherein said first layer of epitaxial silicon is an undoped layer of epitaxial silicon.

36. The method of claim 32, wherein said first layer of epitaxial silicon is doped with either a P-type or an N-type dopant material.

37. The method of claim 32, wherein said semiconductor device comprises at least one of a bipolar transistor, a resistor, a diode, a logic device and a memory device.

38. The method of claim 32, wherein said substrate has a dopant concentration of approximately $1e^{17}$–$5e^{17}$ ions/cm$^3$ of a P-type dopant material.

39. The method of claim 38, wherein said first layer of epitaxial silicon has a dopant concentration less than approximately $1e^{15}$ ions/cm$^3$ of an N-type dopant material.

40. The method of claim 38, wherein said second layer of epitaxial silicon has a dopant concentration greater than approximately $5e^{17}$ ions/cm$^3$ of an N-type dopant material.

41. The method of claim 38, wherein said third layer of epitaxial silicon has a dopant concentration of approximately $5e^{14}$–$1e^{15}$ ions/cm$^3$ of an N-type dopant material.

42. The method of claim 32, wherein said substrate has a dopant concentration of approximately $1e^{17}$–$5e^{17}$ ions/cm$^3$ of an N-type dopant material.

43. The method of claim 42, wherein said first layer of epitaxial silicon has a dopant concentration less than approximately $1e^{15}$ ions/cm$^3$ of a P-type dopant material.

44. The method of claim 42, wherein said second layer of epitaxial silicon has a dopant concentration greater than approximately $5e^{17}$ ions/cm$^3$ of a P-type dopant material.

45. The method of claim 42, wherein said third layer of epitaxial silicon has a dopant concentration of approximately $5e^{14}$–$1e^{15}$ ions/cm$^3$ of a P-type dopant material.

* * * * *

UNITED STATES PATENT AND TRADEMARK OFFICE
CERTIFICATE OF CORRECTION

| | | |
|---|---|---|
| PATENT NO. | : 7,141,478 B2 | Page 1 of 1 |
| APPLICATION NO. | : 10/764777 | |
| DATED | : November 28, 2006 | |
| INVENTOR(S) | : Chris Speyer | |

It is certified that error appears in the above-identified patent and that said Letters Patent is hereby corrected as shown below:

Col. 10, line 45 (claim 17, line 21), change "perfonning" to -- performing --.

Signed and Sealed this

Ninth Day of January, 2007

JON W. DUDAS
*Director of the United States Patent and Trademark Office*